(12) United States Patent
Wang et al.

(10) Patent No.: US 12,447,906 B2
(45) Date of Patent: Oct. 21, 2025

(54) SENSOR CASE, SENSOR SYSTEM AND VEHICLE

(71) Applicant: Beijing Tusen Zhitu Technology Co., LTD., Beijing (CN)

(72) Inventors: Yajia Wang, Beijing (CN); Yuyong Wang, Beijing (CN); Pingyuan Ji, Beijing (CN)

(73) Assignee: Beijing Tusen Zhitu Technology Co., LTD. (CN)

( * ) Notice: Subject to any disclaimer, the term of this patent is extended or adjusted under 35 U.S.C. 154(b) by 412 days.

(21) Appl. No.: 18/137,608

(22) Filed: Apr. 21, 2023

(65) Prior Publication Data

US 2023/0347835 A1    Nov. 2, 2023

(30) Foreign Application Priority Data

Apr. 29, 2022  (CN) .......................... 202210473322.2

(51) Int. Cl.
| | |
|---|---|
| *B60R 11/04* | (2006.01) |
| *G01D 11/24* | (2006.01) |
| *H05K 5/02* | (2006.01) |
| *H05K 5/10* | (2025.01) |
| *B60R 11/00* | (2006.01) |

(52) U.S. Cl.
CPC ............ *B60R 11/04* (2013.01); *G01D 11/245* (2013.01); *H05K 5/0226* (2013.01); *H05K 5/10* (2025.01); *B60R 2011/004* (2013.01)

(58) Field of Classification Search
CPC ..... B60R 11/04; B60R 2011/004; H05K 5/10; H05K 5/0226; G01D 11/245
See application file for complete search history.

(56) References Cited

FOREIGN PATENT DOCUMENTS

| CN | 211741548 U | * 10/2020 | |
| CN | 113085769 A | * 7/2021 | ........... B60R 19/483 |

* cited by examiner

*Primary Examiner* — Jamel E Williams
(74) *Attorney, Agent, or Firm* — Genius Patent APC; Bruce Angus Hare (57) ABSTRACT

The disclosure provides a sensor case, a sensor system, and a vehicle, the sensor case including: a backing plate; a first base plate mounted to the backing plate, the first base plate having a first opening configured for the first sensor to pass through; and a protecting component magnetically coupled to the backing plate, the protecting component including a first cover plate positioned above the first base plate and a first gap being defined between the first cover plate and the first base plate. The sensor case of the disclosure can provide waterproof and rainproof functions of a sensor, and has a simple structure, stable performance, convenient opening and closing, and improved cleaning efficiency of the sensor.

20 Claims, 5 Drawing Sheets

FIG. 8

SENSOR CASE, SENSOR SYSTEM AND VEHICLE

CROSS-REFERENCE TO RELATED APPLICATIONS

The present disclosure claims priority to Chinese Patent Application serial number 202210473322.2, titled "SENSOR CASE, SENSOR SYSTEM AND VEHICLE", filed on Apr. 29, 2022, the content of which is incorporated herein by reference in its entirety.

TECHNICAL FIELD

The disclosure relates to the field of vehicle equipment, in particular, to a sensor case, sensor system, and vehicle.

BACKGROUND

A semi-trailer is a heavy transport vehicle that connects a tractor and a trailer via a draw-bar pin. Compared with a single truck, a semi-trailer can improve the overall economic efficiency of road transportation. With the development of autonomous driving technology, more and more sensors are mounted on automatic drives, such as cameras, laser radars, millimeter wave radars, etc. These sensors are exposed to the outside of the vehicle body, and the light absorption area is often covered by dust, soil, frost, etc. which affects the imaging effect of the sensors. Therefore, a solution that effectively reduces contamination of the sensor is needed.

Embodiments of the disclosure provide a sensor case, a sensor system, and a vehicle to address or at least address the above-mentioned problems.

According to one aspect of an embodiment of the disclosure, there is provided a sensor case comprising:
- a backing plate;
- a first base plate connected to the backing plate, the first base plate having a first opening configured for a first sensor to pass through; and
- a protecting component magnetically coupled to the backing plate, the protecting component comprising a first cover plate positioned above the first base plate, a first gap being defined between the first cover plate and the first base plate.

According to another aspect of an embodiment of the disclosure, there is provided a sensor system comprising: a sensor; and a sensor case as described above for protecting the sensor.

According to another aspect of an embodiment of the disclosure, there is provided a vehicle comprising a frame; and a sensor system as described above mounted on the frame.

According to the technical solution of the embodiments of the disclosure, rainwater and the like are prevented from splashing onto the sensor by the shielding surfaces of the first cover plate and the first base plate, while ensuring the imaging effect of the sensor. A connection between the protecting component and the backing plate is established by means of magnetic suction, and the staff can easily open the protecting component without using tools to perform inspection or cleaning operation on the sensor and improve the working efficiency of the sensor.

BRIEF DESCRIPTION OF THE DRAWINGS

In order to explain the embodiments of the present disclosure or the technical solutions in the prior art more clearly, a brief description will be given below of the drawings which need to be used in the embodiments. It is obvious that the drawings in the following description are only some embodiments of the present disclosure, and it would have been obvious for a person skilled in the art to obtain other drawings according to these drawings without involving any inventive effort.

DETAILED DESCRIPTION

Hereinafter, embodiments of the present invention will be described in detail with reference to the accompanying drawings and examples. The following detailed description of the embodiments and the accompanying drawings are provided to illustrate the principles of the invention and are not intended to limit the scope of the invention, i.e. the invention is not limited to the embodiments described.

According to the description of the present invention, it is to be noted that, unless otherwise indicated, the terms "first" and "second" and the like are used for descriptive purposes and are not to be construed as indicating or implying relative importance; "a plurality of" means two or more; the terms "inner", "outer", "top", "bottom", and the like indicate orientations or positional relationships based on the orientation or positional relationships shown in the figures are merely for convenience in describing and simplifying the present invention and do not indicate or imply that the referenced devices or elements must have a particular orientation, be constructed and operated in a particular orientation and, therefore, should not be construed as limiting the invention.

Figure 1:
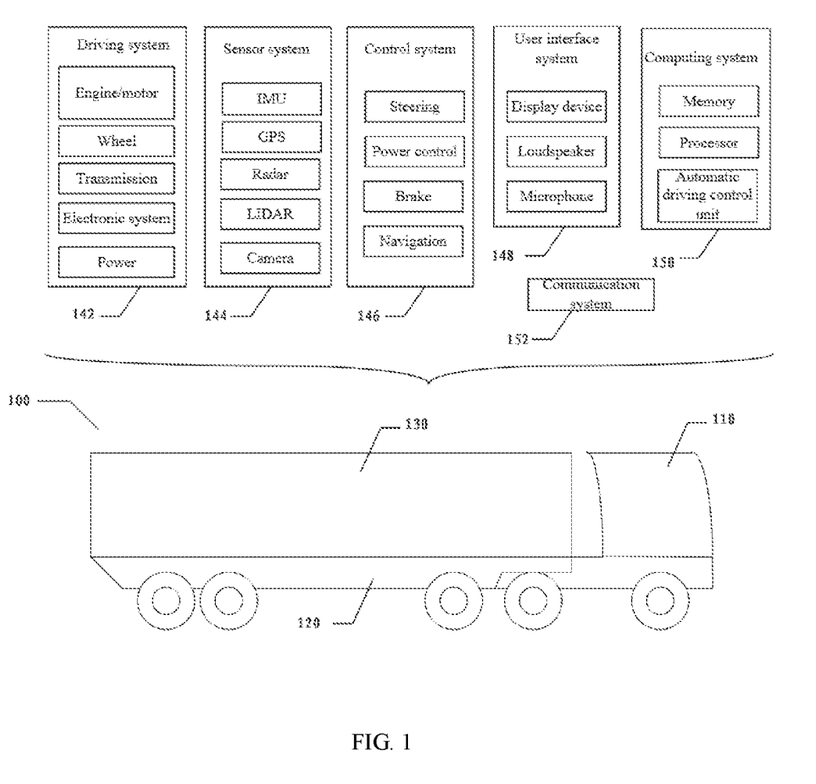
FIG. 1 is a schematic structural diagram of a vehicle 100 according to an embodiment of the disclosure.

A sensor according to an embodiment of the disclosure is mounted on a vehicle, and a vehicle 100 according to the disclosure will be described below with reference to FIG. 1. FIG. 1 is a schematic structural diagram of a vehicle 100 in which various techniques disclosed herein may be implemented. The vehicle 100 may be a car, truck, motorcycle, bus, boat, airplane, helicopter, lawn mower, excavator, motorcycle ski, aircraft, recreational vehicle, amusement park vehicle, farm device, construction device, tram, golf cart, train, tram, or other vehicles. The vehicle 100 may be fully or partially operated in an autonomous driving mode. The vehicle 100 may control itself in the autonomous driving mode, e.g., the vehicle 100 may determine a current state of the vehicle and a current state of an environment in which the vehicle is located, determine a predicted behavior of at least one other vehicle in the environment, determine a level of trust corresponding to a likelihood that the at least one other vehicle will perform the predicted behavior, and control the vehicle 100 itself based on the determined information. While in the autonomous driving mode, the vehicle 100 may operate without human interaction.

The vehicle 100 may comprise various vehicle systems such as a drive system 142, a sensor system 144, a control system 146, a user interface system 148, a computing system 150, and a communication system 152. The vehicle 100 may comprise more or fewer systems, each of which may comprise multiple units. Further, each system and unit of the vehicle 100 may be interconnected. For example, the computing system 150 can be in data communication with one or more of the drive system 142, the sensor system 144, the control system 146, the user interface system 148, and the communication system 152.

The drive system 142 may comprise operational components (or units) that provide kinetic energy to the vehicle 100, and may comprise an engine or electric motor, wheels, a transmission, an electronic system, and power.

The sensor system 144 may comprise sensors for sensing information about the environment and conditions of the vehicle 100. For example, the sensor system 144 may comprise an IMU, a GNSS transceiver (e.g., a GPS transceiver), a RADAR, a laser rangefinder/LIDAR (or other distance measuring devices), an acoustic sensor, an ultrasound sensor, and a camera or an image capture device. The sensor system 144 may comprise sensors for monitoring the vehicle 100 (e.g., oxygen monitors, fuel gauge sensors, engine oil pressure sensors, and temperature, humidity, pressure sensors, etc.).

An IMU may comprise a combination of sensors (e.g., an accelerator and a gyroscope) for sensing positional and directional changes of the vehicle 100 based on inertial acceleration. The GPS transceiver may be any sensor used to estimate the geographic location of the vehicle 100. In some embodiments, the GPS transceiver may be replaced with a Beidou satellite navigation system transceiver or a Galileo satellite navigation system transceiver. The radar unit may use radio signals to sense objects in the environment of the vehicle 100. In some embodiments, the radar unit may also be used to sense the speed and heading of an object approaching the vehicle 100. The laser rangefinder or LIDAR unit (or other distance measuring device) may be any sensor that uses a laser to sense objects in the environment of the vehicle 100. In an embodiment, the laser rangefinder/LIDAR unit may comprise a laser source, a laser scanner, and a detector. The laser rangefinder/LIDAR unit is used to operate in either a continuous (e.g., using heterodyne detection) or discontinuous detection mode. The camera may comprise means for capturing a plurality of images of the environment in which the vehicle 100 is located.

The control system 146 is used for controlling the operation of the vehicle 100 and its components (or units). Accordingly, the control system 146 may comprise various units, such as a steering unit, a power control unit, a braking unit, and a navigation unit.

The user interface system 148 may be used to allow interaction between the vehicle 100 and external sensors, other vehicles, other computer systems, and/or users of the vehicle 100. For example, the user interface system 148 may comprise a standard visual display device (e.g., a plasma display, a liquid crystal display (LCD), a touch screen display, a head mounted display, or other similar displays), a speaker or other audio output devices, a microphone, or other audio input devices. For example, the user interface system 148 may also comprise a navigation interface and an interface to control the internal environment (e.g., temperature, fans, etc.) of the vehicle 100.

A communication system 152 may provide a way for vehicle 100 to communicate with one or more devices or other surrounding vehicles. The computing system 150 can control some or all of the functions of the vehicle 100. The autonomous driving control unit in the computing system 150 may be used to identify, evaluate, and avoid or cross potential obstacles in the environment in which the vehicle 100 is located. The computing system 150 may comprise at least one processor (which may comprise at least one microprocessor) that executes processing instructions (i.e. machine-executable instructions) stored in a non-volatile computer-readable medium, such as a data storage device or memory. The computing system 150 may also be a plurality of computing devices that distributedly control components or systems of the vehicle 100.

In some embodiments, the memory may contain processing instructions (e.g., program logic) that are executed by the processor to perform various functions of the vehicle 100. In an embodiment, the computing system 150 is capable of data communication with other systems, and interfaces in the computing system 150 are used to facilitate data communication between the computing system 150 and the other systems.

The memory may also comprise other instructions, including instructions for data transmission, instructions for data reception, instructions for interaction, or instructions for controlling a drive system 142, a sensor system 144, or a control system 146 or a user interface system 148. In addition, the memory may store a variety of information or data, such as image processing parameters, road maps, and route information.

Although the autonomous driving control unit is shown separate from the processor and memory, it should be understood that in some embodiments, some or all of the functions of the autonomous driving control unit may be implemented with program code instructions residing in one or more memories (or data storage devices) and executed by one or more processors, and that the autonomous driving control unit may in some cases be implemented using the same processor and/or memory (or data storage device).

In some embodiments, the vehicle 100 is a truck, further an autonomous driving truck. The truck comprises a tractor 110 (also referred to as a headstock) and a trailer 120 (also referred to as a tow truck). The tail of the tractor 110 is connected to the head of the trailer 120. Each of the systems 142-152 may be located on the tractor 110, where some of the sensors in the sensor system 144 and some of the communication system 152 may also be distributed on the trailer 120. An autonomous driving truck is typically controlled by a tractor 110 to move a trailer 120 while the truck is traveling. The trailer 120 may be loaded or unloaded with a container 130.

In some embodiments, the sensors in the sensor system 144 may generally comprise a base, a light absorption area, and a cover, and the portions of the structure between the base and the top cover may be considered light absorption areas. For example, a lidar comprises a drive component at the bottom, a top cover at the top, and an light emitting and receiving component in the middle. The camera comprises a base at the bottom, a top cover at the top, and a ring of camera lenses in the middle. When these sensors are exposed to the outside of the body of the vehicle 100, such as when mounted on the frame at the rear of the tractor 110, the surface exposed to the sunshine, rain and water will be accumulated a lot of dirt, dust, dirt, frost, etc. that will cover the imaging surface, affecting the normal use of the sensors.

To this end, the disclosure provides a novel sensor case that protects the sensor by magnetic suction, reducing the probability of contamination of the sensor by providing a shielding surface. Further, the sensor can be inspected or cleaned by pulling the protecting component, and the protecting component can be closed after the inspection or cleaning is completed, so that the whole process is simple, efficient and convenient.

Figure 2:
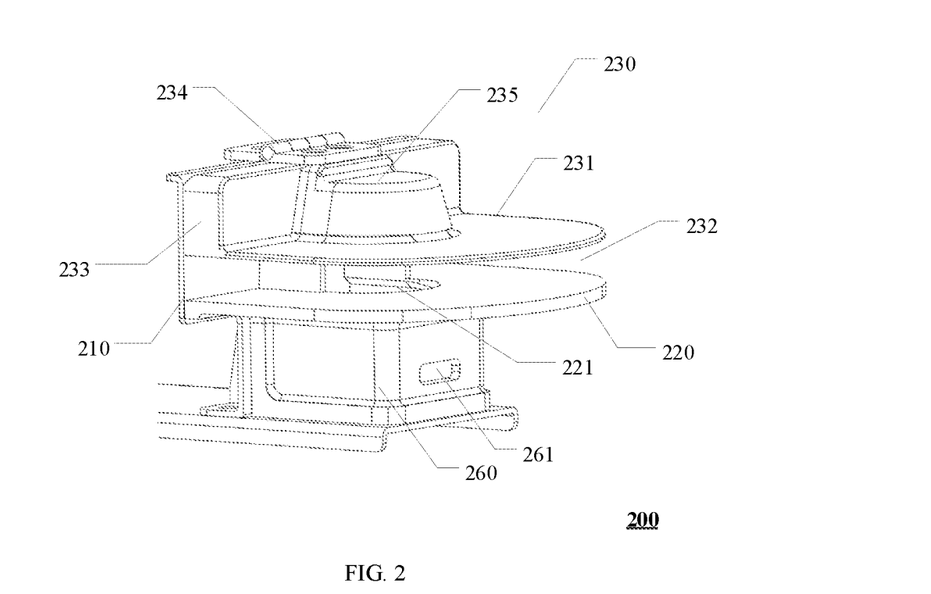
FIG. 2 is a schematic structural diagram of a sensor case 200 according to an embodiment of the disclosure.
Figure 3:
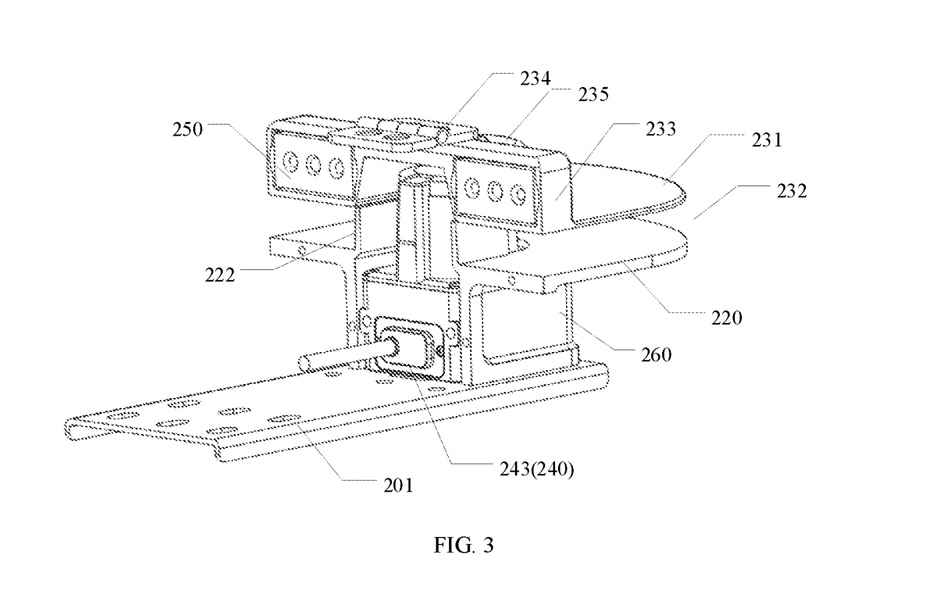
FIG. 3 is a partial schematic structural diagram of the sensor case of FIG. 2.
Figure 4:
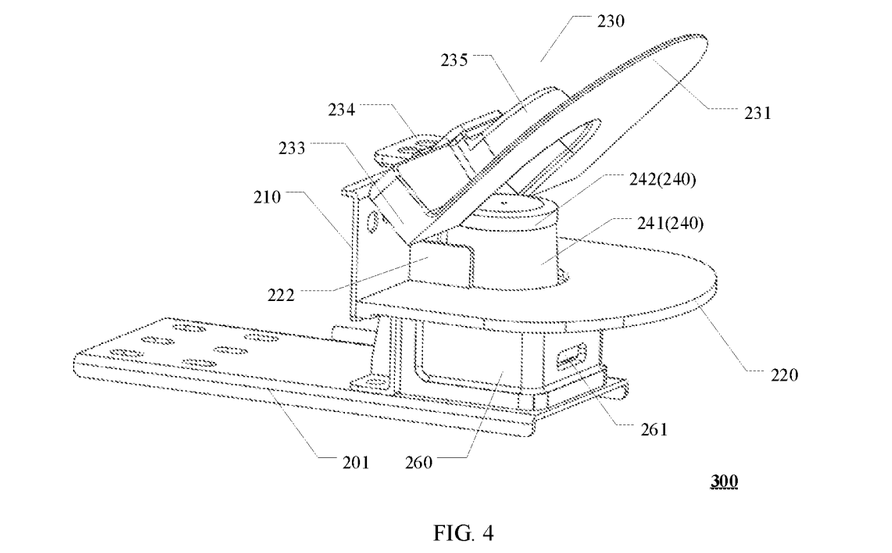
FIG. 4 is a schematic structural diagram of a sensor system 300 according to an embodiment of the disclosure.

FIG. 2 shows a schematic structural diagram of a sensor case 200 according to an embodiment of the disclosure, FIG. 3 is a schematic structural diagram of a portion of the sensor case of FIG. 2, and FIG. 4 is a schematic structural diagram of a sensor system 300 including a sensor case and a first sensor 240 positioned within the sensor case according to an embodiment of the disclosure. FIG. 4 shows a schematic view of a state where the sensor case is opened.

Referring to FIGS. 2 to 4, the sensor case 200 comprises a vertical plate 210 (also called backing plate 210), a first base plate 220, and a protecting component 230. Wherein the first base plate 220 is connected to the vertical plate 210 at a first angle, the first base plate 220 has a first opening 221, and the first opening 221 is configured for the first sensor 240 to pass through, in particular for a light absorption area 241 of the first sensor 240 to pass through. It should be noted that the wording of "connected to" can also be called "mounted to/on" or "provided at" or "located at".

The protecting component 230 comprises a first cover plate 231 which is located above the first base plate 220 and forms a first gap 232 with the first base plate 220, and the first gap 232 satisfies the field angle requirement of the first sensor 240 and can transmit and absorb light passing through the first sensor 240.

The size area of the first cover plate 231 can be provided as needed to provide good waterproof and rainproof effects without the area being too large to affect the imaging performance of the sensor. The height of the first gap 232 can also be provided as needed to meet the imaging requirements and field of view requirements of the first sensor 240 and to prevent rainwater stains from splashing in when the gap is too high. For example, if the first sensor 240 is a lidar, and the imaging field angle thereof needs to satisfy 20 degrees, and given that the origin of the first sensor 240 is A, the tangent point of the circle on the first cover plate 231 farthest from the point A is B, and the tangent point of the circle on the first base plate 220 farthest from the point A is C, then the angle between the line segments AB and AC is greater than or equal to 20 degrees. Thus, the first cover plate 231 may also cover part of the light absorption area of the sensor as desired.

Based on a similar principle, the mounting angle of the first base plate 220 and the first cover plate 231 can also be provided as required, which can be provided horizontally or at an angle with respect to the vertical plate to prevent rainwater from splashing when the mounting angle is too large and prevent affecting the imaging effect when the mounting angle is too small.

The vertical plate 210 (also called backing plate 210) and the protecting component 230 are magnetically coupled. Alternatively, at least one of the vertical plate 210 and the protecting component 230 may be provided with a magnetic device (such as a magnet), for example, one face (the right face in FIG. 2) of the vertical plate 210 adjacent to the protecting component 230 is embedded with a magnetic device to suck the protecting component 230 through the magnetic device; or as shown in FIG. 3, a magnetic device 250 is embedded in one face (the left face in FIG. 3) of the protecting component 230 close to the vertical plate 210 to be attracted on the vertical plate 210 by the magnetic device 250; alternatively, both the vertical plate 210 and the protecting component 230 are provided with magnetic devices that suck each other, and the disclosure does not limit the mounting position of the magnets as long as the magnetic suction effect of the vertical plate 210 and the protecting component 230 can be achieved. In addition, the magnetic suction between the vertical plate 210 and the protecting component 230 can also be achieved by magnetizing the vertical plate 210 and the protecting component 230, and the disclosure is not limited thereto.

In some embodiments, the first cover plate 231 may be magnetically attracted directly to the vertical plate 210. For example, at least one magnetic device is fixed to a side the first cover plate 231 close to the vertical plate 210, or at least one magnetic device is fixed on the side of the vertical plate 210 facing the first cover plate 231, thereby establishing a magnetic coupling between the first cover plate 231 and the vertical plate 210.

In other embodiments, the first cover plate 231 may be magnetically attracted indirectly by the vertical plate 210. At this time, the protecting component 230 further comprises a separating component 233 having a first side (left in FIG. 2) connected to the first cover plate 231 at a second angle, and a second side (right in FIG. 2) magnetically connected to the vertical plate 210. Magnetic devices, such as magnets, may be embedded in the vertical plate 210, in the separating component 233, or in both the vertical plate 210 and the separating component 233. The separating component 233 may be formed separately from the first cover plate 231 or may be formed integrally with the first cover plate 231.

In one implementation, the protecting component 230 is of a clamshell-type structure, e.g., the protecting component 230 may be connected to the vertical plate 210 via a hinge 234 (also referred to as a bisagra). Thus, the light absorption area 241 of the first sensor 240 can be exposed by lifting the protecting component 230. Optionally, the top of the separating component 233 is connected to the vertical plate 210 by a hinge 234, thereby enabling a clamshell-type connection of the protecting component 230.

In some embodiments, the first cover plate 231 comprises a cap 235 and a brim, the interior space of the cap 235 matching the top cover 242 of the first sensor 240 such that the cap 235 covers the top cover 242 of the first sensor 240 when the protecting component 230 is magnetically attracted by the vertical plate 210. That is, the cross-sectional area of the cap 235 is greater than or equal to the cross-sectional area of the top cover 242 or light absorption area of the first sensor 240. Alternatively, the cap 235 may be provided in a clamshell-type structure, i.e. the top cover 242 of the first sensor 240 may be exposed by lifting the cap 235. In some scenarios, the cap 235 may also cover a portion of the light absorption area of the first sensor 240 where some light may be blocked. Optionally, the cross-section of the cap 235 is the same as or similar to the shape of the first opening 221.

The region of the first cover plate 231 other than the cap 235 is a brim, which can provide a light blocking surface of the first sensor, and the width of the brim can be provided as required. Alternatively, the width of the brim is greater than or equal to 4 times the height of the first gap, for example the width of the brim is 9 times the height of the first gap, although not limited thereto.

In addition, according to the disclosure, a specialized bottom shell is designed to protect the base of the sensor. As shown in FIG. 2, the first bottom shell 260 serves to enclose and protect the base 243 of the first sensor 240. The first bottom shell 260 is located below the first base plate 220, and may be a separate component from the first base plate 220 or may be integrally formed with the first base plate 220. The first bottom shell 260 has a first light hole 261 used for displaying an indicator lamp of the first sensor 240. The first light hole 261 may be mounted as a mirror structure if the indicator lamp can be seen through the first light hole 261.

With regard to single-channel lidar, the base thereof is generally a driving component, and the light absorption area is generally an optical transceiving component, then the first bottom shell 260 can enclose and protect the driving component of the single-channel lidar.

Further, it is considered that excessive reflected light is received after the lidar emits light during the turning of the vehicle, which disturbs the imaging. Therefore, the disclosure may further provide a light blocking wall 222 to reduce the influence of the side light on the detection performance of the sensor when the vehicle turns. Specifically, at least one light blocking wall 222 may be provided on the upper surface of the first base plate 220, and the light blocking wall may be provided at the first opening 221. For example, a light blocking wall 222 is provided on both sides of the first opening 221 of the first base plate 220. The height of the light blocking wall 222 is less than or equal to the height of the first gap 232. If the height of the light blocking wall 222 is equal to the height of the first gap 232, the first cover plate 231 is just placed on the light blocking wall 222 when the separating component 233 is attracted by the vertical plate 210.

In another implementation, the protecting component 230 is of a pull-out structure. For example, a stopper plate (not shown in the figure) is provided at the top end of the vertical plate 210 for limiting the suction position of the protecting component 230 on the vertical plate 210. The stopper plate can be provided perpendicular to the vertical plate 210 and forms an L-shaped structure with the vertical plate 210. Thus, when it is desired to clean or inspect the sensor, the protecting component 230 is removed. When the cleaning or inspection is completed, the protecting component 230 is attached to the vertical plate 210 according to the position of the stopper plate. In addition, magnetic means may be provided on the stopper plate to facilitate the protecting component 230 to be magnetically attracted to both the stopper plate and the vertical plate 210.

Alternatively, the protecting component 230 and the vertical plate 210 can also be connected by means of a press hinge (not shown in the figure), the protecting component 230 being snapped onto the vertical plate 210 in an operating state and locked by means of a snap of the press hinge. When it is desired to open the protecting component 230, the protecting component 230 is pressed to release the latch of the press hinge so that the protecting component 230 can be pulled to separate the protecting component 230 from the vertical plate 210 and expose the light absorption area of the sensor.

Figure 5:
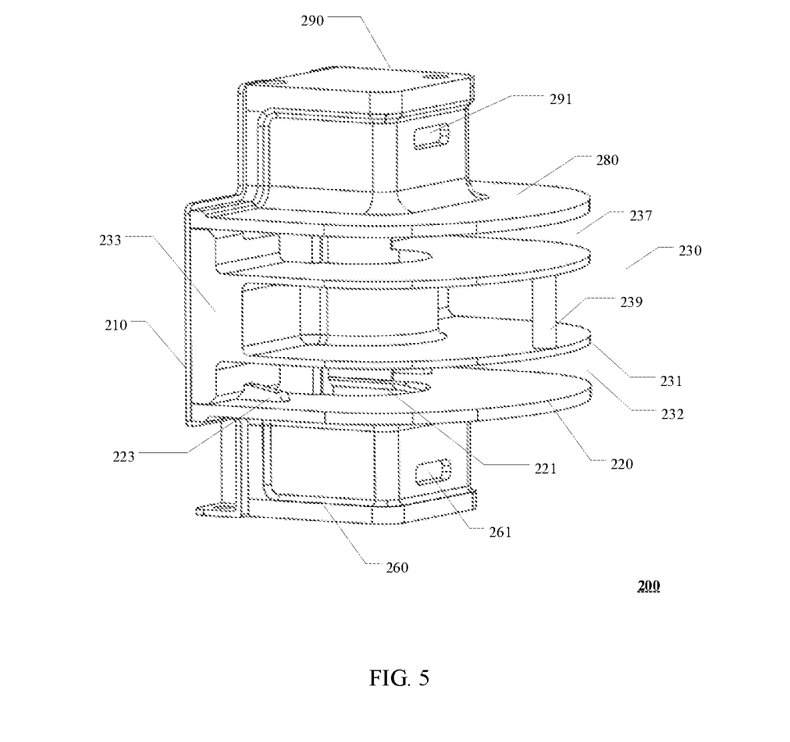
FIG. 5 is a schematic view of a sensor case 200 according to another embodiment of the disclosure.
Figure 7:
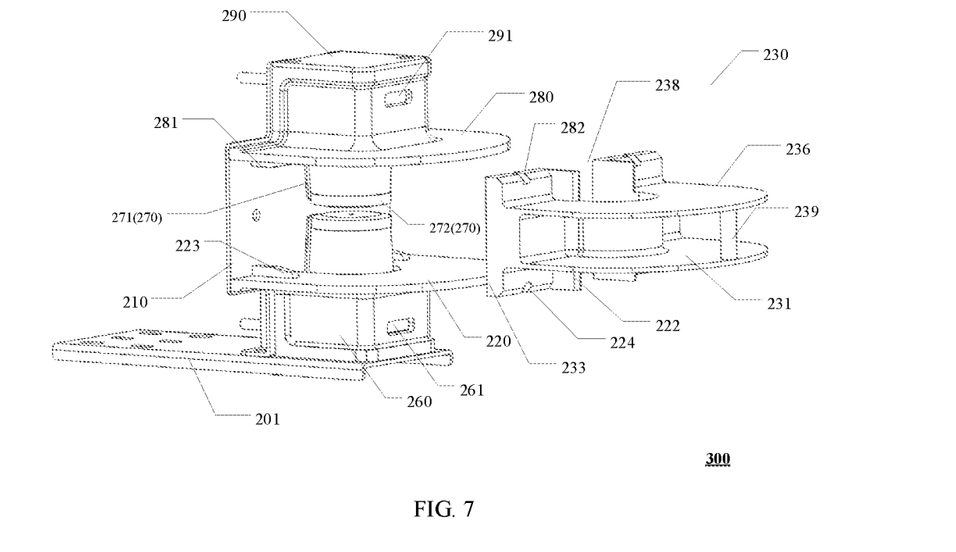
FIG. 7 is a schematic structural diagram of a sensor system 300 according to another embodiment of the disclosure.

In yet another implementation, the pull-out structure of the protecting component 230 can also be implemented as shown in FIGS. 5 and 7, in which the protecting component 230 can slide along the upper surface of the first base plate 220 by an external force. For example, at least one first guide rail 223 is provided on an upper surface of the first base plate 220, and a first slot 224 matched with each first guide rail 223 is provided on the lower surface of the separating component 233, so that the protecting component 230 slides along the first guide rail 223 through the first slot 224, preventing collision between the protecting component 230 and the sensor. Alternatively, the first rail 223 is provided perpendicular to the vertical plate 210 such that the protecting component 230 slides in a direction away from or near the vertical plate 210. Further, the first guide rail 223 has a predetermined slope at an end remote from the vertical plate 210 to facilitate alignment and pull out of the protecting component 230.

It should be understood that the sensor case 200 may protect only one sensor or multiple sensors simultaneously. In particular, in a redundant design of an autonomous driving vehicle, it is possible to place two sensors side by side or aligned up and down, for which the sensor case 200 of the disclosure may also provide a multi-sensor protection scheme. In the case of a multi-sensor arrangement, the reflected light received between the lidars may interfere with each other, thus requiring separate isolation protection of the plurality of sensors.

Figure 6:
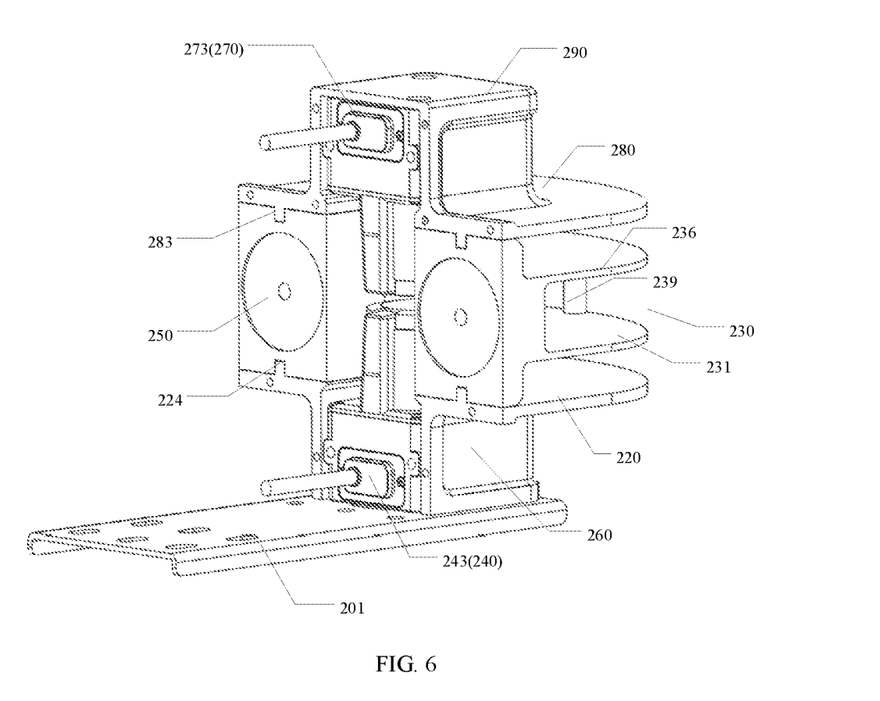
FIG. 6 is a partial schematic structural diagram of the sensor case of FIG. 5.

FIG. 5 shows a schematic view of a multi-sensor case 200 according to an embodiment of the disclosure, and FIG. 6 is a partial structural schematic view of the sensor case of FIG. 5. FIG. 7 shows a schematic structural diagram of a sensor protection system 300 according to another embodiment of the disclosure, and the sensor protection system 300 comprises a sensor case 200 and a first sensor 240 and a second sensor 270 positioned within the sensor case. In this case, the sensor case adopts a pull-out protection mode, and FIG. 5 shows a schematic structural diagram in which the protecting component 230 is magnetically attracted by the vertical plate 210, and FIG. 7 shows a schematic structural diagram in which the protecting component 230 is pulled out.

Referring to FIGS. 5-7, the first sensor 240 and the second sensor 270 are placed to be aligned up and down, wherein the first sensor 240 is placed upright and the second sensor 270 is placed upside down, so that the light absorption area 241 of the first sensor 240 and the light absorption area 271 of the second sensor 270 are provided opposite to each other up and down. A gap is formed between the top cover 242 of the first sensor 240 and the top cover 272 of the second sensor 270.

Similar to the protection structure of the first sensor, the case 200 is also provided with a corresponding second base plate 280 for the second sensor 270, the second base plate 280 being connected to the vertical plate 210 at a third angle and having a second opening (not shown). The second opening is configured for the second sensor 270 to pass through, in particular for the light absorption area 271 of the second sensor 270 to pass through, the second opening corresponding to the position of the first opening 221, e.g., may be located directly above the first opening 221, such that the second sensor 270 is located directly above the first sensor 240.

Optionally, the case 200 also comprises a second bottom shell 290 configured to receive the base 273 of the second sensor 270. The second bottom shell 290 is located above the second base plate 280 as a separate component from the second base plate 280, or may be integrally formed with the second base plate 280. The second bottom shell 290 has a second light hole 291 for displaying an indicator lamp of the second sensor 270. The second light hole 291 mounted in the second light hole 291 as long as the indicator lamp can be seen through the second light hole 291.

In some embodiments, the protecting component 230 further comprises a second cover plate 236 connected at a fourth angle to the separating component 233, the second cover plate 236 positioned above the second cover plate 236 and below the second base plate 280, and forming/defining a second gap 237 with the second base plate 280. Alternatively, the various substructures of the protecting component 230 may be assembled as separate components, or may be integrally formed, without limitation to the disclosure. In addition, the mounting angle of the second cover plate 236 and the second base plate 280, and the height of the second gap 237 can be provided as needed to ensure that a good waterproof and rainproof effect is achieved, and the field angle requirement of the second sensor 270 is met.

In some embodiments, the protecting component 230 further comprises a through-slot 238 extending through the first cover plate 231 and the second cover plate 236, the through-slot 238 corresponding to the position of the first opening 221 such that the through-slot 238 covers the top cover of the first sensor 240 and the second sensor 270 when the protecting component 230 is attracted by the vertical plate 210. The through-slot 238 may also cover portions of the light absorption areas of the first sensor 240 and the second sensor 270, depending on the sensor's field angle requirements and the water height requirements.

In addition, in order to facilitate pulling out the protecting component 230, at least one connection beam 239 (also called handle 239) may be further provided between the first cover plate 231 and the second cover plate 236 to pull out or push back the protecting component 230 by applying a force to the connection beam 239, the connection beam 239 is configured for driving the protecting component 230 to move.

In some embodiments, at least one light blocking wall 222 is provided in at least one of the upper surface of the first base plate 220, the lower surface of the second base plate 280, the lower surface of the first cover plate 231, and the upper surface of the second cover plate 236. The light blocking wall 222 is configured to block a portion of light of the first sensor 240 or the second sensor 270 to reduce interference of light of other sensors, and to reduce interference of side signals when the vehicle turns. In addition, the light blocking wall 222 may be provided at least one of the first opening 221, the second opening, the outlet/exit of the through groove 238, and the inlet/entrance of the through groove 238. It is also possible to arrange the light blocking wall 222 on the vertical plate 210, for example on the side of the vertical plate 210 facing the sensor, perpendicular to the vertical plate 210, and on both sides of the sensor to block part of the light of the sensor.

In some embodiments, at least one second rail 281 is provided below the second base plate 280, and a second slot 282 matching each second rail 281 is provided on the separating component 233 so that the protecting component 230 can slide along the second rail 281 through the second slot 282. Further, if the first guide rail 223 on the first base plate 220 and the second guide rail 281 under the second base plate 280 are provided at the same time, the protecting component 230 can slide based on the defined path of these guide rails, improving the positioning accuracy.

Note that the first angle between the first base plate 220 and the vertical plate 210, the second angle between the separating component 233 and the first cover plate 231, the size of the first cover plate 231, the size of the brim, and the height of the first gap 232 between the first cover plate 231 and the first base plate 220 are all provided according to the imaging requirements of the first sensor. The third angle between the second base plate 280 and the vertical plate 210, the fourth angle between the separating component 233 and the second cover plate 236, and the height of the second gap 237 between the second cover plate 236 and the second base plate 280 are all provided according to the imaging requirements of the second sensor. For example, the first through fourth angles are all right angles. In addition, the size and height of the bottom shell, the size and shape of the first opening 221, the second opening and the through-slot 238, and the height of the cap 235 may also be set according to the height of the base and the height of the top cover of different sensors, and the light absorption area to be shielded, and the disclosure is not limited thereto.

Further, all of the angular, dimensional, height, and width parameters of the disclosure are adjustable. For example, the rotating connection between the first base plate 220 and the vertical plate 210 is provided via a rotating shaft, and the first angle between the first base plate 220 and the vertical plate 210 and the height of the first gap 232 can be adjusted by rotating the first base plate 220; an outer edge of the brim is provided with a corrugated structure, and the width of the brim can be adjusted by stretching the edge of the brim. By the same reasoning, the second angle between the separating component 233 and the first cover plate 231 can be adjusted by rotating the first cover plate 231, the third angle between the second base plate 280 and the vertical plate 210 can be adjusted by breaking the second base plate 280, and the fourth angle between the separating component 233 and the second cover plate 236 can be adjusted by rotating the second cover plate 236. In addition, the connection between the different structures of the disclosure, in addition to the magnetic connection and hinge connection, other ways can be used such as threaded and screw hole connection, of course, the disclosure is not limited to this.

In summary, the disclosure effectively protects the transmission area of the sensor, prevents the coverage of dust, rainwater and frost, and improves the point cloud imaging effect. The disclosure can also effectively shield the interfering radiation at a specific angle, and at the same time, the protecting component is easy to clean by using a magnetic coupling manner, which can solve the problem of affecting working efficiency due to frequent daily cleaning.

The sensor case provided above can be used to protect various types of sensors, such as cameras, millimeter-wave radars, single-channel lidars, multi-channel lidars, etc. The sensor case as well as the internal sensor as a sensor system may be mounted in any position of the vehicle, e.g., on a frame of the vehicle, such as a frame cross beam, a frame side beam, etc. The sensor case 200 may be secured directly to the frame by its bottom shell (e.g., first bottom shell 260 or second bottom shell 290) or may be secured to the frame by base 201.

With the rapid development of the autonomous driving truck technology, the detection of the trailing angle of the autonomous driving truck has gradually become an urgent technical problem to be solved in the art, and the trailing angle of the truck can be effectively detected by mounting a laser radar at the tail of the tractor. To this end, the disclosure also provides a sensor bracket 800 at the rear of the tractor for securing the sensor case 200 and/or the sensor system 300.

Figure 8:
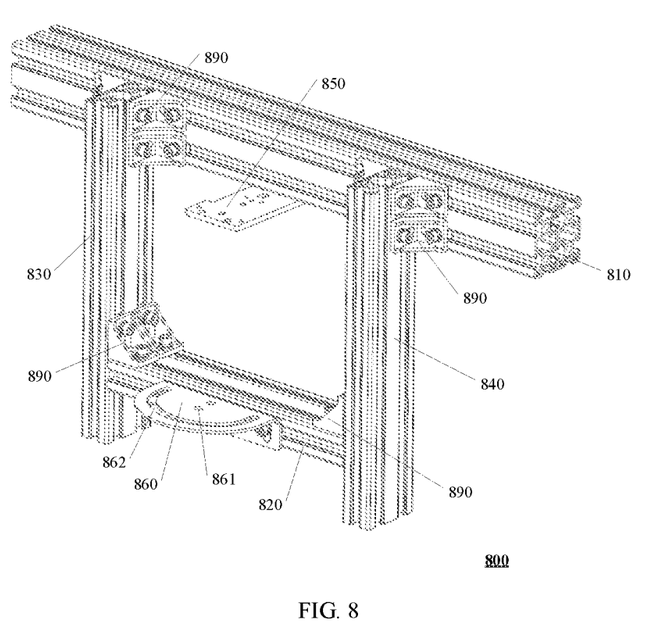
FIG. 8 is a schematic structural diagram of a sensor bracket 800 according to an embodiment of the disclosure.

FIG. 8 shows a schematic structural diagram of a sensor bracket 800 according to an embodiment of the disclosure, which comprises a first cross beam 810, a second cross beam 820, and at least two side beams, as shown in FIG. 8. The at least two side beams comprise, for example, a first side beam 830 and a second side beam 840, although a person skilled in the art would have been able to provide other side beams according to needs, and the disclosure is not limited thereto.

A first side of the first cross beam 810 is mounted on a frame cross beam (which may be referred to as a first frame cross beam for ease of distinction) at the rear of the tractor, the first side can be referred to as the side facing away from the paper, i.e. the back side of the first cross beam 810 is mounted on the first frame cross beam.

The first side beam 830 and the second side beam 840 are vertically fixed to the first cross beam 810. In some embodiments, two side beams are fixed perpendicular to the second side of the first cross beam 810, which can be understood as the side facing the paper, i.e., the front plane, the two side beams are fixed on the front plane of the first cross beam 810. In some embodiments, two side beams may also be fixed vertically below the first cross beam 810, i.e., to the lower plane of the first cross beam 810.

The second cross beam 820 is below the first cross beam 810 and connects at least two side beams. The length of the second cross beam 820 may be just equal to the length between the first side beam 830 and the second side beam 840 when the second cross beam 820 is just against the inner walls of both side beams. The length of the second cross beam may also be greater than the length between the two side beams, in which case the second cross beam 620 may extend a certain distance beyond the side beams on both sides, and the second cross beam 820 is mounted on the front plane or the rear plane of the two columns.

The first beam 810 and the second cross beam 820 may each be used to mount a sensor system of embodiments of the disclosure. A person skilled in the art could also mount other sensor units on the two cross beams according to needs, such as mounting sensors such as a camera, a millimeter wave radar, an IMU, etc. or mounting other types of laser radars, etc.

In some embodiments, each cross beam and each side beam has a T-shaped configuration or a cross-shaped configuration, which is more robust. A #-shaped structure, a ⊔-shaped structure, a 丌-shaped structure, etc. may be formed between the two cross beams and the two side beams, and as long as the cross beams and the side beams can be guaranteed to be vertical, the shape of the holder is not particularly limited in the disclosure.

In some embodiments, each side beam is provided with a first sliding groove (not shown) provided with a scale such that the second cross beam 820 slides up and down along the first sliding groove to adjust the sensor height on the second cross beam 820. Further, the first cross beam 810 may also slide up and down along the first sliding groove to adjust the height of a sensor on the second cross beam 820. Moreover, according to the disclosure, a third cross beam, a fourth cross beam, etc. may also be provide as needed, and the height of the first cross beam 810 and the second cross beam 820 are adjusted when additional beams are needed. This allows a new sensor (e.g., a new laser radar) to be mounted on the new beam.

In other embodiments, the first cross beam 810 and the second cross beam 820 may also be provided with a second sliding groove (not shown), which may also be provided with a scale, so that each side beam slides side-to-side along the second sliding groove, thereby adjusting the position of the two sensors. In addition, by adjusting an interval between the two side beams, for example, when the interval between the two side beams is enlarged, it is possible to increase the space in order to mount a new sensor on the corresponding cross beams. For example, some trailing angle detections require two sensors to be in the same dimension, and the distance between two side beams can be adjusted to mount two sensors on the corresponding cross beams.

That is, according to the disclosure, the number of lidars and single-channel lidars is increased by providing the cross beams and the side beams in a T-shaped structure, and a sliding groove is provided on at least one of the cross beam and the side beam, so that the two laser radars can be adjusted up, down, left, and right, or the distance between the two side beams or the two cross beams can be increased. In this way, a reflecting plate can be matched for different tasks according to the requirements of each task, so that the lidar can collect the point cloud on the reflecting plate.

A person skilled in the art would appreciate that the sliding grooves are provided on the contact surfaces of the cross beams and the side beams, for example, if the rear planes of the two side beams are fixed on the front plane of the cross beams, then the first sliding groove is provided on the rear planes of the corresponding side beams, and the second sliding groove is provided on the front planes of the corresponding cross beams to realize the up, down, left and right sliding between the two. On the contrary, if the front planes of the two side beams are fixed on the rear planes of the cross beams, the first sliding groove is provided on the front plane of the corresponding side beam, and the second sliding groove is provided on the rear plane of the corresponding cross beam. If the upper planes of the two side beams are fixed to the lower plane of the first cross beam 810, the second sliding groove of the first cross beam 810 is provided at a lower plane of the second plane. If the left and right ends of the second cross beam 820 respectively abut against the inner sides of the two side beams, the first sliding groove is provided inside the two side beams.

In some embodiments, multiple sensors (e.g., two lidars) of the disclosure may be mounted directly on the respective beams by providing mounting holes for the sensors directly on the two beams. In other embodiments, a mounting plate may be provided on a cross beam to mount the sensor thereon. Thus, a sensor bracket 800 of the disclosure may further comprise a first mounting plate 850 secured to the first cross beam 810 and a second mounting plate 860 secured to the second cross beam 820 to secure the two sensors to the two mounting plates, respectively. Specifically, a first mounting plate 850 is used to mount a first lidar and a second mounting plate is used to mount a second lidar. A first lidar, such as a single-channel lidar, is mainly used for calculating a trailing angle; the second lidar, such as a multi-channel lidar, is mainly used to supplement the blind area information. The laser light emitted from the first lidar and the second lidar is reflected by a reflecting plate mounted at the front of the trailer.

A first mounting plate 850 is located on a second side of the first cross beam 810 and between at least two side beams. The first mounting plate 850 has a plurality of mounting holes for securing the sensor system as previously described. In some embodiments, the first mounting plate 850 is a planar structure having an upper planar surface snugly secured to a lower planar surface of the first cross beam 810. In other embodiments, the first mounting plate 850 has an L-shaped configuration with a vertical face snugly secured to the front plane of the first cross beam 810.

A second mounting plate 860 is located on a second side of the second cross beam 820 and between the at least two side beams. The second mounting plate 860 serves to fix the second laser radar. The second mounting plate 860 is vertically below the first mounting plate 850, so that the second lidar 880 is vertically below the first lidar 870, facilitating calculation of the distance of the central point. In some embodiments, the second mounting plate 860 is a planar structure having an upper planar surface snugly secured to a lower planar surface of the first cross beam 820.

In other embodiments, the second mounting plate 860 has an L-shaped structure, a vertical surface of the L-shaped structure is fitted and fixed on a second side (i.e. a front plane) of the second cross beam 820, a horizontal surface of the L-shaped structure has a semi-arc shape, and a mounting hole 861 and an arc-shaped mounting groove 862 are provided on the horizontal surface. The mounting hole 861 and the mounting groove 862 match the shape of the multi-channel lidar, in particular, the arc-shaped mounting groove 862 matches the outer contour of the second lidar, for mounting the multi-channel lidar.

A person skilled in the art can select the method of connecting two vertical structural members according to the requirements, for example, the side beam and the first cross beam 810, and the side beam and the second cross beam 820 can be fixed by using a right-angle aluminum 890, which is of course not limited thereto. In addition, the sensor bracket 800 is made of a metal material, such as a mature aluminum alloy profile and an aluminum plate, and is easy to manufacture and renew.

In some embodiments, the sensor bracket 800 further comprises a reflecting plate (not shown in the figure) mounted on the front of the trailer, the reflecting plate being used for reflecting the laser light emitted by the first lidar and/or the second lidar, so that the lidar further receives the laser light reflected by the reflecting plate. With the scanning range of the two lidars and the laser reflected by the reflecting plate, the trailing angle and position of the vehicle when reversing and the environment behind the vehicle can be detected. For example, a single-channel lidar is used to calculate the trailing angle and multi-channel lidar is used to provide blind area information.

In some embodiments, the reflecting plate may be mounted directly to the second frame cross beam at the front of the trailer or may be mounted to the second frame cross beam at the front of the trailer via a reflecting plate bracket. The reflecting plate bracket (not shown in the figure) may also be provided in a cross beam and a side beam structure, and a third sliding groove may be provided on the cross beam and/or the side beam, so that the reflecting plate slides up, down, left and right along the sliding groove to match scanning ranges of different lidars. For example, the reflecting plate bracket may comprise two side beams mounted on the second frame cross beam, the two side beams having sliding grooves so that the reflecting plate slides up and down. Alternatively, the reflecting plate bracket may be of two cross beams, may be one cross beam and one side beam (T-shaped or cross-shaped), may also be of two cross beams and one side beam (I-shaped or H-shaped), or two cross beams and two side beams, and the specific structure of the reflecting plate holder is not limited in the disclosure.

In some embodiments, the sensor bracket 800 further comprises a shock absorber (not shown), such as an elastic member, mounted on a first side of the first cross beam 810 for providing a damping function between the first cross beam 810 and the first frame cross beam.

In some embodiments, the sensor bracket 800 further comprises a rotation member (not shown) on a first side of the first cross beam 810 to adjust the angle of the first cross beam 810 on the first frame cross beam and, in turn, adjust the detection angle of the trailing angle and blind area information.

In some embodiments, the sensor bracket 800 also comprises a weight reduction member (not shown), such as a plurality of weight reduction holes in the mounting holder, to reduce the weight of the holder and ease the burden on the vehicle body.

It can be seen that the sensor bracket 800 of the disclosure can integrate a variety of sensors into a unitary structure, with overall cooperative performance stabilization. According to the solution, the invention is simple and firm in structure, easy to operate, easy to adjust and easy to replace to improve user experience. The structure adopts mature hard aluminum alloy profile and aluminum plate, and a frame cross beam cable hole of the original vehicle is used as the mounting point, which can reduce the manufacturing cost and speed up the manufacturing cycle without changing the original vehicle structure. Further, the disclosure may adjust the cross beam, side beam position of the sensor bracket or the cross beam, side beam position of the reflecting plate holder according to different task requirements to meet different detection requirements.

It should be understood by a person skilled in the art that the foregoing description is only illustrative of specific embodiments of the present invention, and that the scope of the present invention is not limited thereto. It will be apparent to a person skilled in the art that various modifications and variations can be made in the disclosure without departing from the spirit or scope of the disclosure. Thus, it is intended that the disclosure cover the modifications and variations of the disclosure provided they come within the scope of the appended claims and their equivalents.

What is claimed is:

1. A sensor case, comprising:
   a backing plate;
   a first base plate mounted to the backing plate, the first base plate having a first opening configured for a first sensor to pass through; and
   a protecting component magnetically coupled to the backing plate, the protecting component comprising a first cover plate positioned above the first base plate, and a first gap being defined between the first cover plate and the first base plate.

2. The sensor case according to claim 1, wherein
   the protecting component is of clamshell-type, and the top of the protecting component is mounted to the backing plate via a hinge.

3. The sensor case according to claim 1, wherein the protecting component further comprises:
   a separating component having a first side mounted to the first cover plate, and a second side magnetically coupled to the backing plate.

4. The sensor case according to claim 3, wherein
   the top of the separating component is mounted to the backing plate via a hinge;
   at least one of the protecting component and the backing plate has a magnetic device.

5. The sensor case according to claim 4, wherein
   the first cover plate comprises a cap and a brim, an inner space of the cap is matched with the top of the first sensor, so that the cap covers the top of the first sensor when the protecting component is attracted by the backing plate.

6. The sensor case according to claim 1, wherein
   the protecting component is drawable and is operable to slide along the first base plate under an external force.

7. The sensor case according to claim 1, wherein
   the first base plate is provided with at least one first guide rail, and the separating component is provided with at least one first slot matched with each first guide rail such that the protecting component is operable to slide along the first guide rail through the first slot.

8. The sensor case according to claim 7, wherein
   the first rail is perpendicular to the backing plate, and the first rail has a predetermined slope at an end remote from the backing plate such that the protecting component is operable to slide near the backing plate.

9. The sensor case according to claim 1, further comprising:
a first bottom shell configured to house a base of the first sensor; and
a second bottom shell configured to house a base of a second sensor.

10. The sensor case according to claim 9, wherein
the first bottom shell has a first light hole for displaying an indicator lamp of the first sensor;
the second bottom shell has a second light hole for displaying an indicator lamp of the second sensor.

11. The sensor case according to claim 1, further comprising:
a second base plate mounted to the backing plate and having a second opening corresponding in position to the first opening, the second opening being configured for the second sensor to pass through.

12. The sensor case according to claim 11, wherein the protecting component further comprises:
a separating component having a first side mounted to the first cover plate, and a second side magnetically coupled to the backing plate; and
a second cover plate mounted to the separating component, located above the first cover plate and below the second base plate, and defining a second gap with the second base plate.

13. The sensor case according to claim 12, wherein the protecting component further comprises:
a through-slot extending through the first cover plate and the second cover plate, the through-slot corresponding to the position of the first opening such that the through-slot covers the top of the first sensor and the top of the second sensor when the protecting component is attracted by the backing plate.

14. The sensor case according to claim 12, wherein
a connection beam is provided between the first and second cover plates and is configured to drive the protecting component to move.

15. The sensor case according to claim 12, wherein
at least one of a surface of the first base plate, a surface of the second base plate, a surface of the first cover plate or a surface of the second cover plate is provided with at least one light blocking wall configured to block part of the light of the first sensor or the second sensor, the light blocking wall is provided at the first opening or the second opening.

16. The sensor case according to claim 12, wherein
the second base plate is provided with at least one second guide rail, and the separating component is provided with at least one second slot matching each second guide rail, so that the protecting component is able to slide along the second guide rail through the second slot.

17. The sensor case according to claim 12, wherein the backing plate is mounted at a first angle to the first base plate, the separating component is mounted at a second angle to the first cover plate, the backing plate is mounted at a third angle to the second base plate, the separating component is mounted at a fourth angle to the second cover plate, the first through fourth angles, the width of the brim, the first gap height, and the second gap height are adjustable.

18. A sensor system, comprising:
a sensor; and
a sensor case comprising:
a backing plate;
a first base plate mounted to the backing plate, the first base plate having a first opening configured for a first sensor to pass through; and
a protecting component magnetically coupled to the backing plate, the protecting component comprising a first cover plate positioned above the first base plate, and a first gap being defined between the first cover plate and the first base plate.

19. The sensor system according to claim 18, wherein the sensor comprises a first sensor and a second sensor, the second sensor is placed upside down so that a light absorption area of the second sensor and a light absorption area of the first sensor are provided opposite to each other up and down.

20. A vehicle, comprising:
a frame; and
a sensor system mounted on the frame, wherein the sensor system comprises a sensor and a sensor case comprising:
a backing plate;
a first base plate mounted to the backing plate, the first base plate having a first opening configured for a first sensor to pass through; and
a protecting component magnetically coupled to the backing plate, the protecting component comprising a first cover plate positioned above the first base plate, and a first gap being defined between the first cover plate and the first base plate.

* * * * *